(12) United States Patent
Alon et al.

(10) Patent No.: US 7,869,775 B2
(45) Date of Patent: Jan. 11, 2011

(54) CIRCUIT AND METHOD FOR BIASING A GALLIUM ARSENIDE (GAAS) POWER AMPLIFIER

(75) Inventors: Ziv Alon, Thousand Oaks, CA (US); Shiaw W. Chang, Thousand Oaks, CA (US); Andre Metzger, Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 713 days.

(21) Appl. No.: 11/842,333

(22) Filed: Aug. 21, 2007

(65) Prior Publication Data

US 2008/0102759 A1 May 1, 2008

Related U.S. Application Data

(60) Provisional application No. 60/855,338, filed on Oct. 30, 2006.

(51) Int. Cl.
*H04B 1/04* (2006.01)
*H04M 1/00* (2006.01)

(52) U.S. Cl. ............... 455/127.1; 455/572; 455/343.1

(58) Field of Classification Search .............. 455/127.1, 455/251.1, 343.1, 311, 341, 127.2, 127.3, 455/572, 573; 330/296, 289, 285, 297
See application file for complete search history.

(56) References Cited

U.S. PATENT DOCUMENTS

| 4,320,352 | A | 3/1982 | Rubin et al. | |
|---|---|---|---|---|
| 6,043,714 | A * | 3/2000 | Yamamoto et al. | 330/296 |
| 6,242,986 | B1 * | 6/2001 | Adar | 330/302 |
| 6,486,724 | B2 | 11/2002 | Sakamoto et al. | |
| 6,617,928 | B2 * | 9/2003 | Finlay et al. | 330/288 |
| 7,400,202 | B2 * | 7/2008 | Yamamoto et al. | 330/296 |
| 7,417,507 | B2 * | 8/2008 | Yamamoto et al. | 330/296 |
| 7,522,001 | B2 * | 4/2009 | Yamamoto et al. | 330/285 |
| 2006/0186962 | A1 | 8/2006 | Apel et al. | |

* cited by examiner

*Primary Examiner*—Sonny Trinh (57) ABSTRACT

A circuit for biasing a gallium arsenide (GaAs) power amplifier includes a reference voltage generator circuit implemented in a gallium arsenide (GaAs) material system, a field effect transistor (FET) bias circuit implemented in the gallium arsenide material system and adapted to receive an output of the reference voltage generator circuit and adapted to provide an output to a radio frequency (RF) amplifier stage.

23 Claims, 5 Drawing Sheets

CIRCUIT AND METHOD FOR BIASING A GALLIUM ARSENIDE (GAAS) POWER AMPLIFIER

CROSS REFERENCE TO RELATED APPLICATION

This application claims priority to co-pending U.S. provisional application entitled, "TEMPERATURE AND PROCESS COMPENSATED, VREF INDEPENDENT GAAS MONOLITHIC VOLTAGE CONTROLLED POWER AMPLIFIER BIAS CIRCUIT," having Ser. No. 60/855,338, filed on Oct. 30, 2006, and which is entirely incorporated herein by reference.

BACKGROUND

Portable communication devices, such as cellular telephones, use one or more power amplifiers to amplify an information signal prior to transmission. One of the technologies used to fabricate a power amplifier for a portable communication device uses the gallium arsenide (GaAs) material system. A typical GaAs power amplifier operates using a reference voltage signal on the order of approximately 2.8 volts (V) to bias the transistors that make up the power amplifier. Biasing the transistors is important to establish the proper quiescent current. Further, the bias current should be consistent across different parts and over temperature and process variations. However, generating the reference voltage signal in the GaAs material system provided challenges. As a result of these challenges, a nominal 2.8V reference voltage signal is typically provided by circuitry separate from the GaAs material system from which the power amplifier is fabricated. Unfortunately, this adds cost and complexity to the portable communication device.

In addition, to reduce power consumption in modern portable communication devices, virtually all of the other components in the portable communication device are being designed and manufactured to operate at lower voltage and current levels. For example, most modern components of a portable communication device are being designed to operate at a nominal voltage of approximately 1.8V. This nominal 1.8V may vary between approximately 1.2V and 1.8V. This further complicates the ability to provide the GaAs-based power amplifier with the desired nominal 2.8V reference voltage signal.

Further, portable communication device manufacturers desire the ability to supply a voltage control signal to set the bias current of a power amplifier based on the power level to be transmitted.

Therefore, it would be desirable to have a bias circuit that overcomes these challenges.

SUMMARY

Embodiments of the invention include a circuit for biasing a gallium arsenide (GaAs) power amplifier including a reference voltage generator circuit implemented in a gallium arsenide (GaAs) material system and a field effect transistor (FET) bias circuit implemented in the gallium arsenide material system and adapted to receive an output of the reference voltage generator circuit and adapted to provide an output to a radio frequency (RF) amplifier stage.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the circuit and method for biasing a gallium arsenide (GaAs) power amplifier (also referred to as the GaAs bias circuit) can be implemented in any GaAs device in which it is desirable to provide a bias voltage. Further, the circuitry to be described below can be fabricated using an integrated bipolar-field effect transistor (BIFET) process utilizing the lower turn-on voltage of FET transistors. Further, in particular embodiments, the transistors to be described below comprise bipolar junction transistors (referred to as a BJT), which includes heterojunction bipolar junction transistors (referred to as an HBT) and field effect transistors (referred to as a FET) that are fabricated using what is referred to as the bipolar complementary metal oxide semiconductor (BICMOS) process.

The circuit and method for biasing a gallium arsenide (GaAs) power amplifier are generally implemented in hardware. However, one or more of the signals that control the circuit and method for biasing a gallium arsenide (GaAs) power amplifier can be implemented in software, or a combination of hardware and software. When implemented in hardware, the circuit and method for biasing a gallium arsenide (GaAs) power amplifier can be implemented using specialized hardware elements. When one or more of the control signals for the circuit and method for biasing a gallium arsenide (GaAs) power amplifier are generated at least partially in software, the software portion can be used to precisely control the operating aspects of various components in a bias circuit associated with a device. The software can be stored in a memory and executed by a suitable instruction execution system (microprocessor). The hardware implementation of the circuit and method for biasing a gallium arsenide (GaAs) power amplifier can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), a separate, specially designed integrated circuit for biasing purposes, etc.

The software for the circuit and method for biasing a gallium arsenide (GaAs) power amplifier comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

Figure 1:
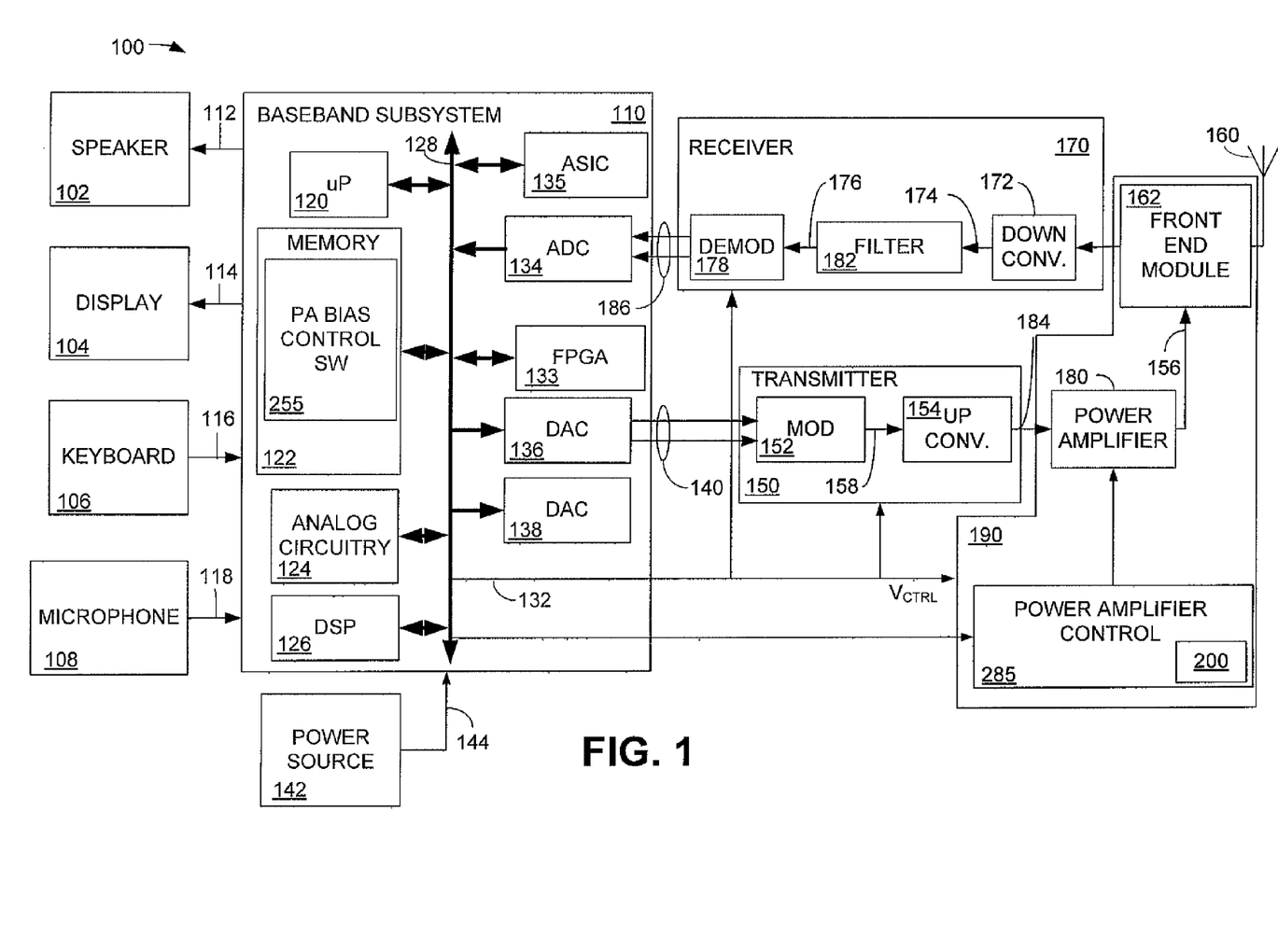
FIG. 1 is a block diagram illustrating a simplified portable transceiver including an embodiment of a circuit and method for biasing a gallium arsenide (GaAs) power amplifier.

FIG. 1 is a block diagram illustrating a simplified portable transceiver 100 including an embodiment of a circuit and method for biasing a gallium arsenide (GaAs) power amplifier. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the circuit and method for biasing a gallium arsenide (GaAs) power amplifier is implemented, the baseband subsystem 110 may also include one or more of an application specific integrated circuit (ASIC) 135 and a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150, receiver 170, power amplifier 180 and the power amplifier control element 285 such as through connection 132 for example.

The baseband subsystem 110 generates a bias control signal, referred to as $V_{CTRL}$, which is supplied to the power amplifier control element 285 via connection 132. The bias control signal $V_{CTRL}$ is generated by the baseband subsystem 110 and is converted to an analog control signal by the digital-to-analog converter (DAC) 138. The bias control signal $V_{CTRL}$ is illustrated as being supplied from the bus 128 to indicate that the signal may be generated in different ways as known to those skilled in the art. The bias control signal $V_{CTRL}$ is a reference voltage signal that is defined by the transmit power. Higher power levels require higher bias current from the power amplifier (PA) 180. The signal, $V_{CTRL}$ determines the bias current in the power amplifier 180 by determining the bias level of the power amplifier 180.

The control signals on connection 132 may originate from the DSP 126, the ASIC 135, the FPGA 133, or from microprocessor 120, and are supplied to a variety of connections within the transmitter 150, receiver 170, power amplifier 180, and the power amplifier control element 285. It should be noted that, for simplicity, only the basic components of the portable transceiver 100 are illustrated herein. The control signals provided by the baseband subsystem 110 control the various components within the portable transceiver 100. Further, the function of the transmitter 150 and the receiver 170 may be integrated into a transceiver.

In an embodiment, the power amplifier 180 and the power amplifier control element 285 are located on the same semiconductor die 190. The semiconductor die 190 is also referred to as a PA MMIC (monolithic microwave integrated circuit).

The power amplifier control element 285 includes the GaAs bias circuit 200, which determines the bias current in the RF transistors of the power amplifier 180. The desired bias current is a function of the desired output power of the power amplifier 180. In a power amplifier implemented in the code division multiple access (CDMA) and wideband code division multiple access (WCDMA) communications systems, the bias current can be used to control the gain of the power amplifier. In addition, bias current can be reduced in order to reduce the power consumption and heat generated in the power amplifier. However, the power amplifier begins to distort the signal when bias current drops below a certain level. This bias current threshold is dictated by the output power. The communication device therefore continuously varies the signal $V_{CTRL}$ as the output power level of the power amplifier changes. For CDMA and WCDMA modulation schemes power amplifier output power is typically set by the transmitter's upconverter 154 and pre-amplifier stage (not shown).

If at least some portions of the control circuitry for the circuit and method for biasing a gallium arsenide (GaAs) power amplifier are implemented in software that is executed by the microprocessor 120, the memory 122 will also include power amplifier bias control software 255. The power amplifier bias control software 255 comprises one or more executable code segments that can be stored in the memory and executed in the microprocessor 120. Alternatively, the functionality of the power amplifier bias control software 255 can be coded into the ASIC 135 or can be executed by the FPGA 133, or another device. Because the memory 122 can be rewritable and because the FPGA 133 is reprogrammable, updates to the power amplifier bias control software 255 can be remotely sent to and saved in the portable transceiver 100 when implemented using either of these methodologies.

Baseband subsystem 110 also includes analog-to-digital converter (ADC) 134 and digital-to-analog converters (DACs) 136 and 138. In this example, the DAC 136 generates the in-phase (I) and quadrature-phase (Q) signals 140 that are applied to the modulator 152. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information on connection 140 and provides a modulated signal via connection 158 to upconverter 154. The upconverter 154 transforms the modulated signal on connection 158 to an appropriate transmit frequency and provides the upconverted signal to a power amplifier 180 via connection 184. The power amplifier 180 amplifies the signal to an appropriate power level for the system in which the portable transceiver 100 is designed to operate.

Details of the modulator 152 and the upconverter 154 have been omitted, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed.

The power amplifier 180 supplies the amplified signal via connection 156 to a front end module 162. The front end module comprises an antenna system interface that may include, for example, a diplexer having a filter pair that allows simultaneous passage of both transmit signals and receive signals, as known to those having ordinary skill in the art. The transmit signal is supplied from the front end module 162 to the antenna 160.

A signal received by antenna 160 will be directed from the front end module 162 to the receiver 170. The receiver 170 includes a downconverter 172, a filter 182, and a demodulator 178. If implemented using a direct conversion receiver (DCR), the downconverter 172 converts the received signal from an RF level to a baseband level (DC), or a near-baseband level (~100 kHz). Alternatively, the received RF signal may be downconverted to an intermediate frequency (IF) signal, depending on the application. The downconverted signal is sent to the filter 182 via connection 174. The filter comprises a least one filter stage to filter the received downconverted signal as known in the art.

The filtered signal is sent from the filter 182 via connection 176 to the demodulator 178. The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
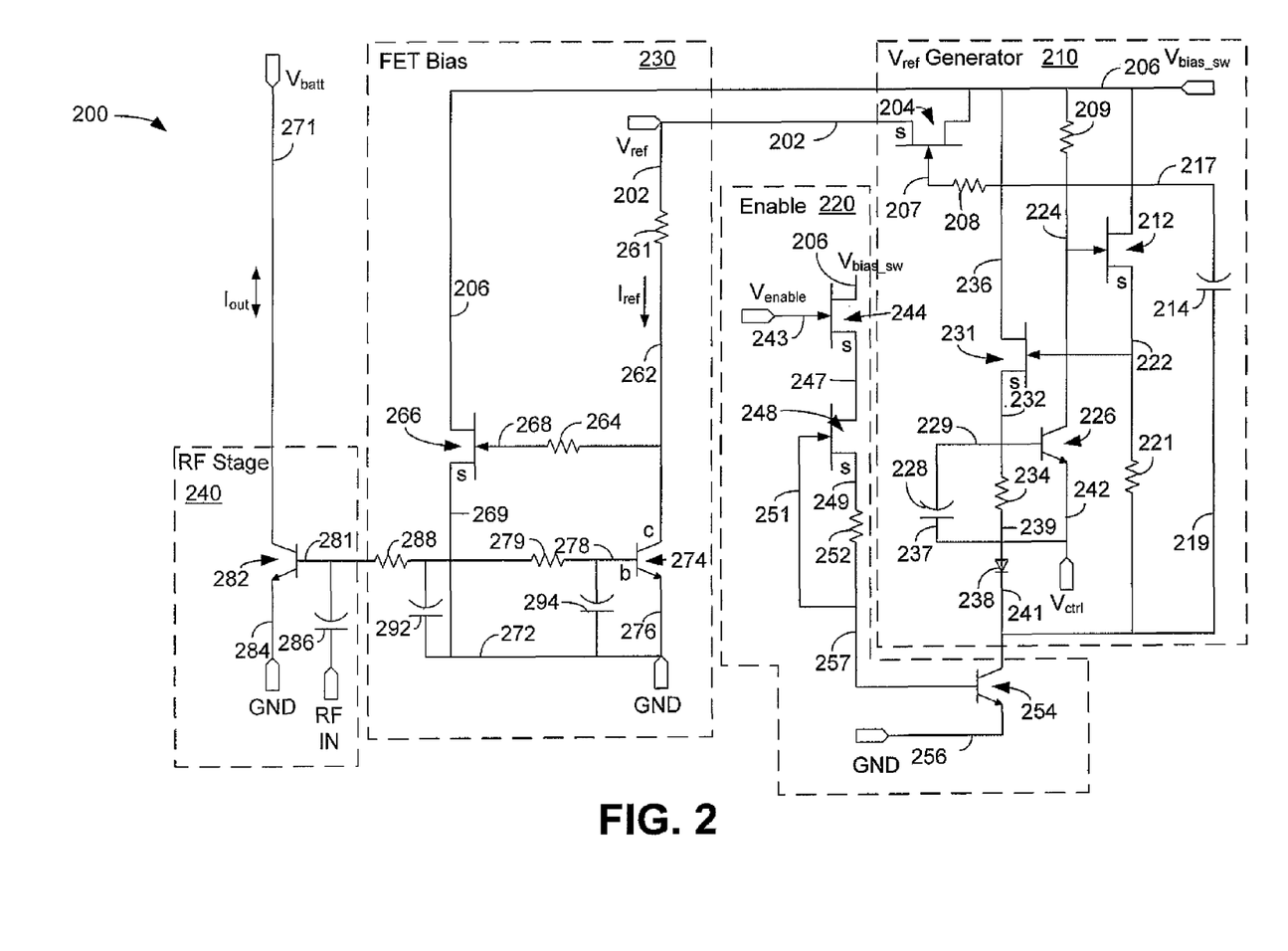
FIG. 2 is a schematic diagram illustrating an embodiment of the gallium arsenide (GaAs) bias circuit of FIG. 1.

FIG. 2 is a schematic diagram illustrating an embodiment of the gallium arsenide (GaAs) bias circuit 200 of FIG. 1. The GaAs bias circuit 200 is wholly implemented in the gallium arsenide material system. The GaAs bias circuit 200 includes a reference voltage generator portion, referred to as the Vref generator 210, an enable circuit 220 and a field effect transistor (FET) bias circuit 230. A radio frequency (RF) stage 240 is not part of the bias circuit 200, but part of the power amplifier. The RF stage 240 is shown in FIG. 2 for illustrating how the RF stage 240 is typically connected to the GaAs bias circuit 200. The transistors in the GaAs bias circuit 200 comprise bipolar Junction transistors (referred to as a BJT), which includes heterojunction bipolar junction transistors (referred to as an HBT) and field effect transistors (referred to as a FET) that are fabricated using what is referred to as the bipolar-FET semiconductor (BiFET) process.

The Vref generator 210 includes a field effect transistor (FET) 204 having a source terminal 202 arranged as the output of the circuit and a drain terminal 206 connected to a signal referred to as Vbias_sw. The gate terminal of the FET 204 is connected to a resistor 208, which is connected via connection 217 to a capacitor 214.

A resistor 209 is connected to Vbias_sw on connection 206 and is connected to the gate terminal of the FET 212 via connection 224. The drain terminal of the FET 212 is connected to Vbias_sw on connection 206. The source terminal of the FET 212 is connected via connection 222 to the gate terminal of FET 231. A resistor 221 is connected between the gate of the FET 231 and connection 219.

The drain terminal of the FET 231 is connected to Vbias_sw on connection 236 and the source terminal of the FET 231 is connected via connection 232 to a resistor 234. The resistor 234 is connected to a diode 238 via connection 239. The diode 238 is connected to the collector terminal of the transistor 254. The emitter terminal of the transistor 254 is connected to ground on connection 256. As will be described below, as part of the enable circuit 220, the transistor 254 functions to shut off the Vref generator 210 by disconnecting the ground connection.

A collector terminal of the transistor 226 is coupled via connection 224 and resistor 209 to Vbias_sw on connection 206 while the emitter terminal of the transistor 226 is coupled to connection 242, which is an externally supplied control voltage signal, $V_{CTRL}$. The $V_{CTRL}$ signal is supplied from outside of the Vref generator 210, typically by the baseband subsystem 110 (FIG. 1), and is usually on the order of zero to 1.2 V. The base terminal 229 of the transistor 226 is coupled to a capacitor 228. The capacitor 228 is coupled to the control signal, $V_{CTRL}$, on connection 242.

The enable circuit 220 includes a FET 244 having a drain terminal coupled to Vbias_sw on connection 206 and a source terminal 247 coupled to the drain terminal of FET 248. The source terminal 249 of the FET 248 is coupled to a resistor 252. The resistor 252 is coupled to the gate 251 of the FET 248 and is also coupled to the base terminal 257 of the transistor 254. An enable signal, Venable, is supplied to the gate terminal 243 of the FET 244. The enable signal, Venable, is such that a nominal 0 V level represents off and a nominal 1.0 V level represents on.

The FET bias circuit 230 includes a resistor 261 coupled to the reference signal, Vref, on connection 202. The reference signal on connection 202 is the output provided by the Vref generator 210. The resistor 261 is also coupled via connection 262 to the resistor 264 and to the collector terminal of the transistor 274. The emitter terminal 276 of the transistor 274 is coupled to ground.

The FET bias circuit 230 also includes a FET 266 having a drain terminal connected to Vbias_sw on connection 206 and a source terminal connected to ground 272. A resistor 288 and a capacitor 292 are coupled to node 281. The resistor 288 is also coupled to the base terminal of the transistor 282 in the RF stage 240. The capacitor 292 is also coupled to ground 272. The resistor 288 and the capacitor 292 form a first RC filter. A resistor 279 and a capacitor 294 are coupled to the base terminal 278 of the transistor 274. The resistor 279 is also coupled to the node 281. The capacitor 294 is also coupled to ground 272. The resistor 279 and the capacitor 294 form a second RC filter.

The voltage signal at node 281 is the bias signal, Vbias, that biases the transistor 274 and the RF stage 240. The gate terminal 268 of the FET 266 is coupled to the resistor 264.

The RF stage 240 includes an exemplary output transistor 282, which is biased by the signal, Vbias, on connection 281 from the FET bias circuit 230. The collector terminal of the transistor 282 is coupled to a supply voltage, also referred to as battery voltage, Vbatt, on connection 271. The RE transmit signal is provided to the output transistor 282 through a capacitor 286. The transistor 274 and the transistor 282 form a current mirror such that the value of the current Iref is proportional to the current Iout.

The Vref generator 210 is essentially a voltage translator. The Vref generator 210 translates the $V_{CTRL}$ control signal on connection 242 that is provided at approximately 0 to 1.2V up by approximately 0.9 V, to approx. 1-2.2V, such that the FET bias circuit 230 can bias the RF stage 240 using an externally supplied control signal, $V_{CTRL}$, that is on the order of 0-1.2V. All FETs, including FET 204 have a negative turn on voltage. The output of the FET 204 on connection 202 creates a modified current mirror in that the RF stage 240 mirrors the current of the transistor 274.

The Vref generator 210 also compensates for temperature and threshold voltage differences or variations in FET 266. The base to emitter voltage, Vbe, of the transistor 274 varies with temperature, but varies little with process. The threshold voltage of the FET 266 varies with both temperature and process. Therefore, the Vref generator 210 compensates for this temperature and process variation. Specifically, the transistor 226 compensates for the transistor 274, the FET 231 compensates for the FET 266, and the FET 212 compensates for the FET 204. Essentially, all of the FETs on the chip will vary with process and temperature approximately the same amount.

The capacitor 228 prevents the transistor 226 from rectifying any RF voltage present at connection 242 relative to ground.

With regard to the enable circuit 220, the Venable signal on connection 243 is used to simultaneously remove the voltage Vbias_sw on connection 206 while the transistor 254 is % used to open the ground connection on connection 256 from the Vref generator 210. The enable circuit 220 is also used to disconnect the ground from the Vref generator 210, as will be described below. In this manner, no leakage current flows through the Vref generator 210 when the enable circuit 220 is activated.

Regarding the FET bias circuit 230, the FET 266 ensures that the current Iref flows only to the collector of the transistor 274, while the current mirror is able to provide high current to the transistor 282. The FET 266 also lowers the voltage at the collector of transistor 274 to a value below the base voltage of the transistor 274, allowing greater voltage headroom in the circuit. In this manner, the circuitry shown in FIG. 2 allows the use of a $V_{CTRL}$ control signal of approximately 0 to 1.2 V, which is common on current generation CMOS components, to control a GaAs power amplifier stage by translating the control voltage to a nominal value of approximately 1.3V. The circuitry shown in FIG. 2 also compensates for process and temperature variation in the components.

The GaAs bias circuit 200 provides an alternative bias circuit for GaAs that does not require a conventional voltage reference signal. The Vref generator 210 uses an analog control voltage, $V_{CTRL}$, to set bias current of the RF stage 240. In this manner, an implementer of the portable communication device 100 can control the bias level of the power amplifier based on a desired power level of the transmitter. The GaAs bias circuit 200 allows a GaAs power amplifier to be controlled via $V_{CTRL}$ at a nominal value of 0 to 1.2 volts, which is easily generated by the CMOS circuitry of the chipset of a portable communication device 100. The control voltage, $V_{CTRL}$, is ten translated and corrected for temperature and process variation by the Vref Generator 210. Higher voltages needed to bias the RF stage 240 are kept internal on the PA MMIC and do not need to be supplied by an external CMOS chipset.

Figure 3:
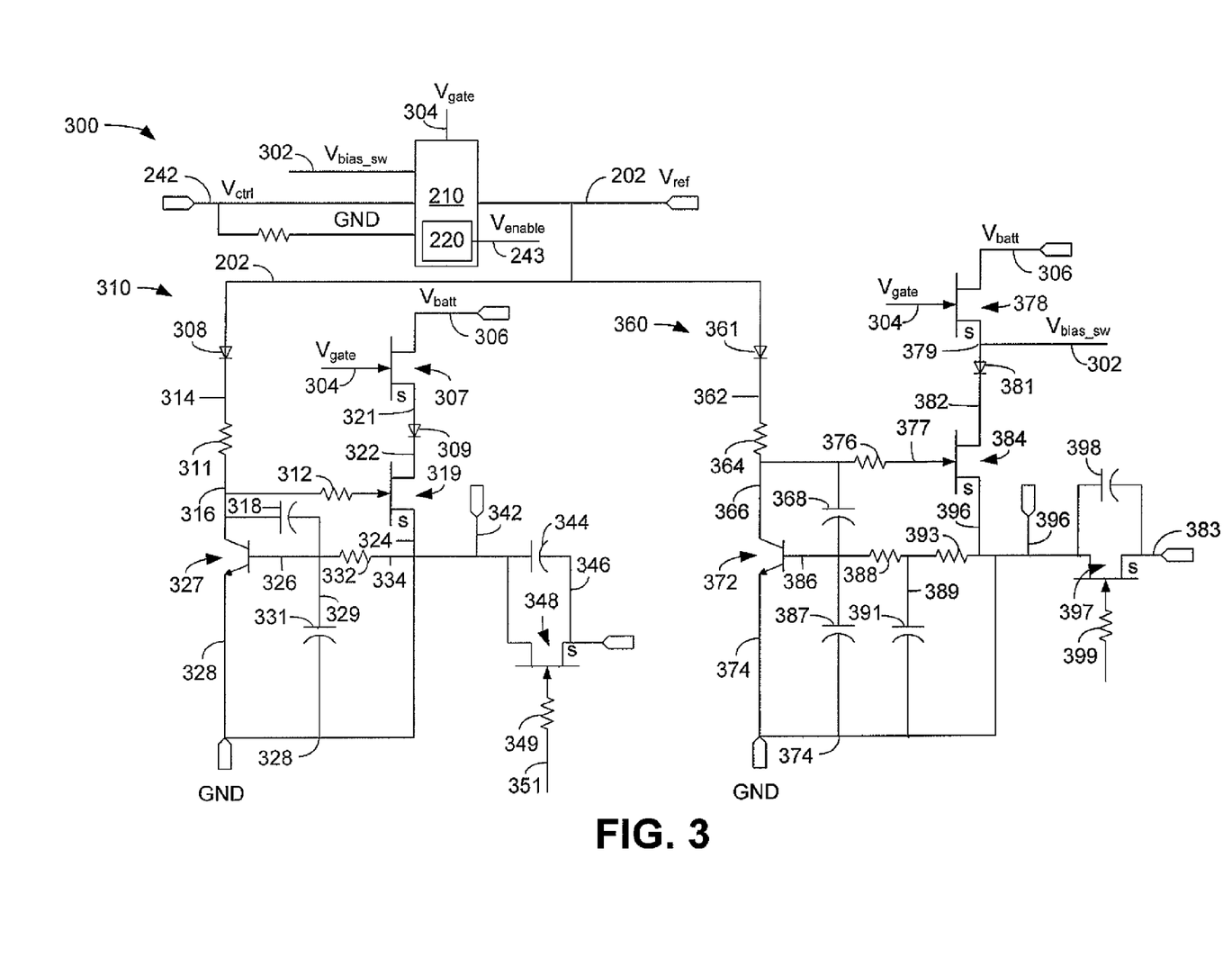
FIG. 3 is a schematic diagram illustrating of the Vref generator of FIG. 2, two instances of the FET bias circuit of FIG. 2, and circuitry to supply two RF output stages.

FIG. 3 is a schematic diagram 300 illustrating the Vref generator 210 of FIG. 2, two instances of the FET bias circuit 230 of FIG. 2, and circuitry to supply two RF output stages. The Vref generator 210, which, in FIG. 3, implicitly includes the enable circuit 220, receives a control signal, Vgate, on connection 304. The Vref generator 210 also receives a bias signal, referred to as Vbias_sw, on connection 302, the control signal, Vctrl, on connection 242 and the Venable signal on connection 243. The output of the Vref generator 210 on connection 202 is the reference signal, Vref, described above.

The Vref signal is supplied via connection 202 to first bias stage 310 and to a second bias stage 360. The bias stages 310 and 360 are each similar to the FET bias circuit 230 described above. The bias stage 310 includes a diode 308 coupled via connection 314 to a resistor 311. The resistor 311 is coupled via connection 316 to a resistor 312 and to a capacitor 318. The capacitor 318 prevents the reference device, transistor 327, from amplifying stray RF voltages. The transistor 327 should only handle DC voltages. Any RF voltages present in the bias circuit should be filtered out as they can by rectified and thus impair the circuit. The resistor 311 is also coupled to the collector terminal of a transistor 327. The emitter terminal of the transistor 327 is coupled via connection 328 to ground. The capacitor 318 is connected to the base terminal 326 and the collector terminal 316 of the transistor 327. A capacitor 331 is also connected via connection 329 between the base terminal 326 of transistor 327 and ground 328.

The Vbatt signal on connection 306 is coupled to the drain terminal of FET 307. The signal Vgate is supplied via connection 304 to the gate terminal of the FET 307. The source terminal of the FET 307 is coupled via connection 321 to a diode 309. The diode 309 is also coupled to the drain terminal of FET 319 via connection 322. The gate terminal of the FET 319 is coupled to the resistor 312 and the source terminal of the FET 319 is coupled via connection 324 to the resistor 332. The resistor 332 and the capacitor 331 form a first RC filter to prevent RF energy from entering the bias circuitry and thus allow the bias signal to be connected directly to an RF transistor (not shown) on connection 342.

The output of the bias stage 310 is provided on connection 342 to an RF amplifier stage (not shown) and to the drain terminal of the FET 348 and to a capacitor 344. The source terminal of the FET 348 is connected via connection 346 to the capacitor 344. The gate terminal of the FET 348 is coupled to a resistor 349 via connection 351. The FET 348 allows the Vref signal to be mirrored to another RF stage via the source terminal of the FET 348.

The bias stage 360 includes a diode 361 coupled via connection 362 to a resistor 364. The resistor 364 is coupled via connection 366 to a resistor 376 and to a capacitor 368. The capacitor 368 prevents the reference device, transistor 372, from amplifying stray RF voltages. The transistor 372 should only handle DC voltages. Any RF voltages present in the bias circuit should be filtered out as they can by rectified and thus impair the circuit. The resistor 364 is also coupled to the collector terminal of a transistor 372. The emitter terminal of the transistor 372 is coupled via connection 374 to ground. The capacitor 368 is connected to the base terminal 386 and the collector terminal 366 of the transistor 372. A capacitor 387 is also connected via connection 386 between the base terminal 386 of transistor 372 and ground 376. A resistor 388 is connected between the base terminal of the transistor 372 and the resistor 393. A capacitor 391 is connected between the resistors 388 and 393 and ground 374. The resistors 388 and 393 and the capacitors 387 and 391 form a second RC filter having two poles to prevent RF energy from entering the bias circuitry and thus allow the bias signal to be connected to an r transistor (not shown) on connection 396.

The Vbatt signal on connection 306 is coupled to the drain terminal of FET 378. The signal Vgate is supplied via connection 304 to the gate terminal of the FET 378. The source terminal of the FET 378 is coupled via connection 379 to a diode 381. The diode 381 is also coupled to the drain terminal of FET 384 via connection 382. The gate terminal of the FET 384 is coupled to the resistor 376 and the source terminal of the FET 384 is coupled via connection 396 to the resistor 393.

The output of the bias stage 360 is provided on connection 396 to an RF amplifier stage (not shown) and to the drain terminal of the FET 397 and to a capacitor 398. The source terminal of the FET 397 is connected via connection 383 to the capacitor 398. The gate terminal of the FET 397 is coupled to a resistor 399. The FET 397 allows the Vref signal to be mirrored to another RF stage via the source terminal of the FET 397.

The FET 319 and the FET 384 effectively lower the turn-on voltage of the transistors 327 and 372, respectively.

Figure 4:
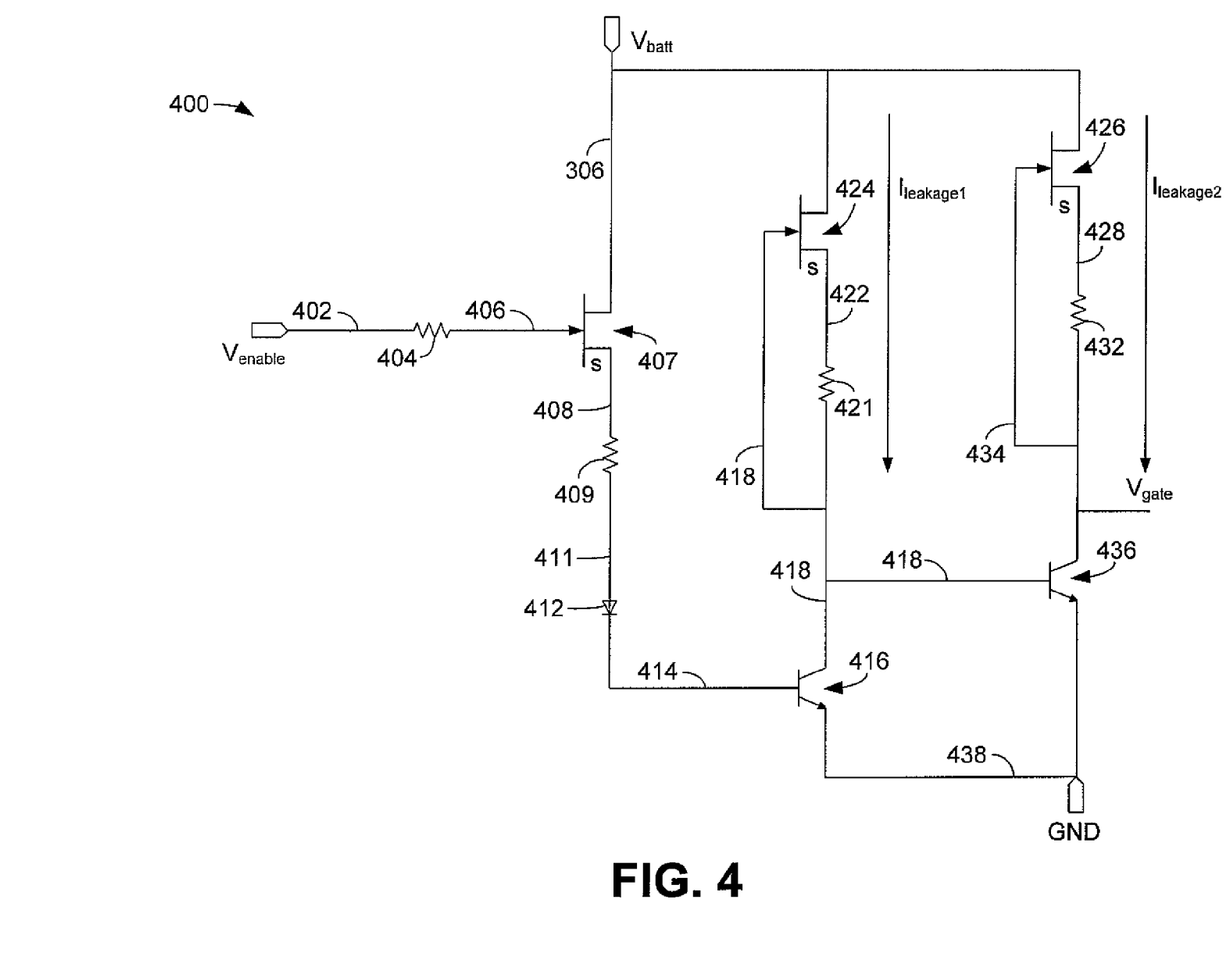
FIG. 4 is a schematic diagram showing a refresh circuit.

FIG. 4 is a schematic diagram showing a refresh circuit 400. The refresh circuit 400 includes a FET 407 having a gate terminal 406 connected via a resistor 404 to the Venable signal on connection 402. The drain terminal of the FET 407 is connected via connection 306 to the Vbatt signal. The Vbatt signal on connection 306 is also connected to the drain terminal of a FET 424 and to the drain terminal of a FET 426.

The source terminal of the FET 407 is connected to a resistor 409 via connection at 408. The resistor 409 is connected to a diode 412 via connection 411. The diode 412 is connected via connection 414 to the base terminal of a transistor 416.

The source terminal of the FET 424 is connected to a resistor 421 via connection 422. The resistor 421 is also connected via connection 418 to the gate terminal of the FET 424. The resistor 421 is also coupled to the base terminal of the transistor 436 and to the collector terminal of the transistor 416. The current flowing through the FET 424 is referred to as Ileakage1.

The source terminal of the FET 426 is connected to a resistor 432 via connection 428. The resistor 432 is also connected via connection 434 to the gate terminal of the FET 426. The resistor 432 is also coupled to the collector terminal of the transistor 436. The emitter terminals of the transistors 416 and 436 are connected via connection 438. The collector terminal 434 of the transistor 436 forms the output of the refresh circuit 400 and is referred to as the voltage signal Vgate. The current flowing through the FET 426 is referred to as Ileakage2.

The enable circuit 220 and the refresh circuit 400 both use the Venable signal to turn the power amplifier on and off. The enable circuit 220 disconnects the ground from the Vref generator circuit 210, while the refresh circuit 400 sets the voltage Vgate to either 0 or battery voltage. The voltage Vgate in turn is also used to turn the power amplifier on and off.

The refresh circuit 400 controls the voltage Vgate to effectively disconnect the battery voltage, Vbatt, from the circuit (Vbias_sw is turned on/off via the voltage Vgate). However, this is insufficient to completely shut off the power amplifier because the GaAs FETs do not behave as ideal switches. As a result some battery voltage will still be present when the referesh circuit 400 adjusts Vgate to zero. The enable circuit 220 is used to disconnect the ground, effectively cutting off the Vref generator circuit 21 from all power sources.

When the voltage signal, Vgate, is low, Vbatt is removed from the Vref generator circuit 210, thus creating an effective on/off switch in the GaAs material system. In this manner, no leakage current flows through the Vref generator 210 when the enable circuit 220 is activated. The refresh circuit 400 acts as a buffer (double inverter) in GaAs. Due to the lack of a p-type device in the GaAs process, an ideal static inverter (one that does not dissipate power at static state) cannot be made. The refresh circuit 400 effectively emulates two inverters and consumes minimal power because the currents Ileakge1 and Ileakage2 are minimized.

Figure 5:
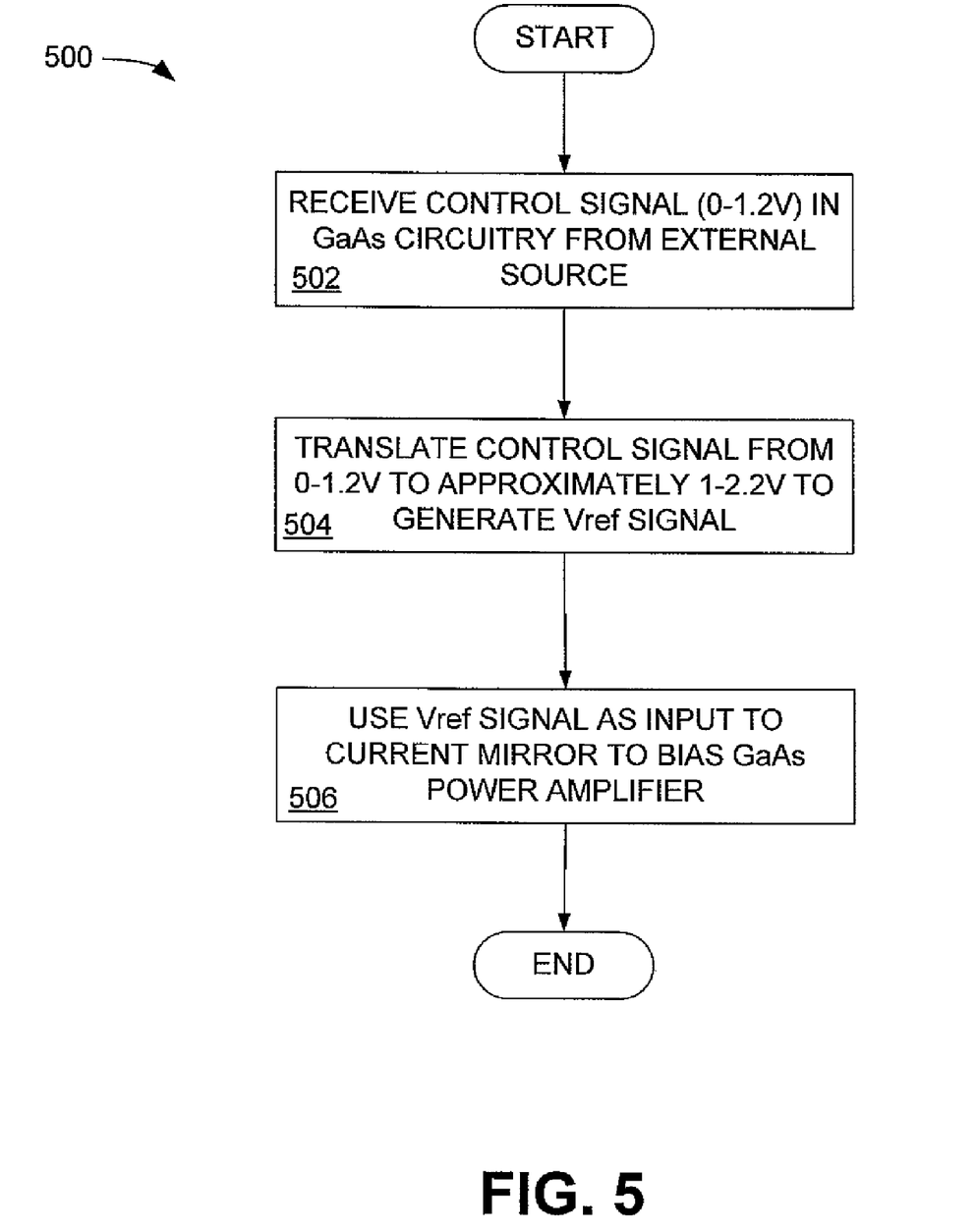
FIG. 5 is a flow chart describing the operation of an embodiment of the gallium arsenide (GaAs) bias circuit of FIG. 1.

FIG. 5 is a flow chart describing the operation of an embodiment of the gallium arsenide (GaAs) bias circuit of FIG. 1. In block 502, a control signal, such as Vctrl, is received in the GaAs bias circuit 200. As an example, the control signal, Vctrl, can have a magnitude on the order of 0-1.2V. In block 504, the GaAs bias circuit 200 translates the control signal from approximately 0-1.2V to approximately 1-2.2V Vref. The current mirror formed by the transistors 274 and 282 (FIG. 2) then translates the Vref signal to about 1.3V to generate a base bias voltage signal that is used to bias the transistor 282. In block 506, the Vref signal is used as an input to a current mirror to bias a GaAs power amplifier.

While various embodiments of the invention have been described, it will be apparent to those of ordinary skill in the art that many more embodiments and implementations are possible that are within the scope of this invention.

What is claimed is:

1. A circuit for biasing a gallium arsenide (GaAs) power amplifier, comprising:
 a reference voltage generator circuit implemented in a gallium arsenide (GaAs) material system, the reference voltage generator circuit comprising:
  a first bipolar transistor adapted to compensate for temperature variations in a second bipolar transistor located in the FET bias circuit;
  a first field effect transistor (FET) adapted to compensate for temperature and process variations in a second FET located in the FET bias circuit;
  a third FET adapted to compensate for temperature and process variations in a fourth FET located in the reference voltage generator circuit; and
 a field effect transistor (FET) bias circuit implemented in the gallium arsenide material system and adapted to receive an output of the reference voltage generator circuit and adapted to provide an output to a radio frequency (RF) amplifier stage.

2. The circuit of claim 1, in which the reference voltage generator circuit is adapted to receive an externally supplied control signal on the order of 0-1.2 volts (V) and adapted to translate the externally supplied control signal to approx. 1-2.2V, and is adapted to provide temperature and process compensation.

3. The circuit of claim 1, in which the fourth FET (204) has a negative turn on voltage.

4. The circuit of claim 1, in which the second bipolar transistor and a third bipolar transistor located in the RF amplifier stage form a current mirror that is controlled by the second FET in the FET bias circuit.

5. The circuit of claim 4, in which the second FET in the FET bias circuit has a negative turn on voltage and lowers a bias voltage of the third bipolar transistor, thus effectively lowering the turn-on voltage of the RF amplifier stage and operating the current mirror below the turn on voltage of the second bipolar transistor.

6. The system of claim 1, further comprising an enable circuit coupled to the reference voltage generator circuit, the enable circuit adapted to simultaneously disconnect a voltage source from the reference voltage generator circuit and open a ground connection to the reference voltage generator circuit, thereby substantially eliminating leakage current through the reference voltage generator circuit.

7. The system of claim 1, further comprising a refresh circuit adapted to disconnect a voltage source from the reference voltage generator circuit.

8. The system of claim 7, in which the refresh circuit further comprises a gallium arsenide inverter.

9. A portable transceiver having a circuit for biasing a gallium arsenide (GaAs) power amplifier, comprising:
 a transmitter operatively coupled to a receiver;
 a power amplifier control element including:
 a reference voltage generator circuit implemented in a gallium arsenide (GaAs) material system, the reference voltage generator circuit comprising:
  a first bipolar transistor adapted to compensate for temperature variations in a second bipolar transistor located in the FET bias circuit;

a first field effect transistor (FET) adapted to compensate for temperature and process variations in a second FET located in the FET bias circuit;

a third FET adapted to compensate for temperature and process variations in a fourth FET located in the reference voltage generator circuit; and a field effect transistor (FET) bias circuit implemented in the gallium arsenide material system and adapted to receive an output of the reference voltage generator circuit and adapted to provide an output to a radio frequency (RF) amplifier stage.

10. The transceiver of claim 9, in which the reference voltage generator circuit adapted to receive an externally supplied control signal on the order of 0-1.2 volts (V) and adapted to translate the externally supplied control signal to approx. 1-2.2V, and is adapted to provide temperature and process compensation.

11. The transceiver of claim 9, in which the fourth FET has a negative turn on voltage.

12. The transceiver of claim 9, in which the second bipolar transistor and a third bipolar transistor located in the RF amplifier stage form a current mirror that is controlled by the second FET in the FET bias circuit.

13. The transceiver of claim 12, in which the second FET in the FET bias circuit has a negative turn on voltage and lowers a bias voltage of the third bipolar transistor, thus effectively lowering the turn-on voltage of the RF amplifier stage and operating the current mirror below the turn on voltage of the second bipolar transistor.

14. The transceiver of claim 9, further comprising an enable circuit coupled to the reference voltage generator circuit, the enable circuit adapted to simultaneously disconnect a voltage source from the reference voltage generator circuit and open a ground connection to the reference voltage generator circuit, thereby substantially eliminating leakage current through the reference voltage generator circuit.

15. The transceiver of claim 9, further comprising a refresh circuit adapted to disconnect a voltage source from the reference voltage generator circuit.

16. The transceiver of claim 15, in which the refresh circuit further comprises two gallium arsenide inverters.

17. A method for biasing a gallium arsenide (GaAs) power amplifier, comprising:

receiving an analog control signal in a gallium arsenide (GaAs) reference voltage generator circuit;

translating the analog control signal from approximately 0-1.2V to approximately 1-2.2V to generate a bias voltage reference signal;

controlling a current mirror using the bias voltage reference signal to bias a GaAs power amplifier;

using a first bipolar transistor to compensate for temperature variations in a second bipolar transistor located in a FET bias circuit;

using a first field effect transistor (FET) to compensate for temperature and process variations in a second FET located in the FET bias circuit; and using a third FET to compensate for temperature and process variations in a fourth FET located in the reference voltage generator circuit.

18. The method transceiver of claim 17, further comprising:

forming the second bipolar transistor and a third bipolar transistor into a current mirror; and controlling the current mirror using the second FET in the FET bias circuit.

19. The method of claim 18, in which the second FET in the FET bias circuit has a negative turn on voltage and lowers a bias voltage of the third bipolar transistor, thus effectively lowering the turn-on voltage of the RF amplifier stage and operating the current mirror below the turn on voltage of the second bipolar transistor.

20. The method of claim 17, further comprising simultaneously disconnecting a voltage source from the reference voltage generator circuit and opening a ground connection to the reference voltage generator circuit, thereby substantially eliminating leakage current through the reference voltage generator circuit.

21. The method of claim 17, further comprising using a gallium arsenide buffer to disconnect a voltage source from the reference voltage generator and current mirror circuit.

22. A method for biasing a gallium arsenide (GaAs) power amplifier, comprising:

receiving an analog control signal in a gallium arsenide (GaAs) reference voltage generator circuit;

translating the analog control signal from approximately 0-1.2V to approximately 1-2.2V using a reference voltage generator circuit to generate a bias voltage reference signal;

controlling a current mirror using the bias voltage reference signal to bias a GaAs power amplifier; and simultaneously disconnecting a voltage source from the reference voltage generator circuit and opening a ground connection to the reference voltage generator circuit, thereby substantially eliminating leakage current through the reference voltage generator circuit.

23. A method for biasing a gallium arsenide (GaAs) power amplifier, comprising:

receiving an analog control signal in a gallium arsenide (GaAs) reference voltage generator circuit;

translating the analog control signal from approximately 0-1.2V to approximately 1-2.2V using a reference voltage generator circuit to generate a bias voltage reference signal;

controlling a current mirror using the bias voltage reference signal to bias a GaAs power amplifier; and using a gallium arsenide buffer to disconnect a voltage source from the reference voltage generator and current mirror circuit.

* * * * *